US008672087B2

(12) United States Patent
Stewart, Jr. et al.

(10) Patent No.: US 8,672,087 B2
(45) **Date of Patent: *Mar. 18, 2014**

(54) CEILING LOUDSPEAKER SUPPORT SYSTEM

(71) Applicant: RGB Systems, Inc., Anaheim, CA (US)

(72) Inventors: William C. Stewart, Jr., Raleigh, NC (US); Michael Hudson, Nashville, NC (US); Larry Frerichs, Raleigh, NC (US); Clinton Strong, Apex, NC (US); Weldon Gammon, Raleigh, NC (US)

(73) Assignee: RGB Systems, Inc., Anaheim, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/786,214

(22) Filed: Mar. 5, 2013

(65) Prior Publication Data

US 2013/0251181 A1 Sep. 26, 2013

Related U.S. Application Data

(63) Continuation-in-part of application No. 13/161,022, filed on Jun. 15, 2011, which is a continuation of application No. 13/159,801, filed on Jun. 14, 2011, now Pat. No. 8,286,749, which is a continuation of application No. 12/795,218, filed on Jun. 7, 2010, now Pat. No. 8,109,360, which is a continuation of application No. 12/355,730, filed on Jan. 16, 2009, now Pat. No. 7,866,438, which is a continuation of application No. 12/163,929, filed on Jun. 27, 2008, now Pat. No. 7,861,825.

(51) Int. Cl.
*H05K 5/00* (2006.01)

(52) U.S. Cl.
USPC .......................................... 181/150; 181/148

(58) Field of Classification Search
USPC .................................................. 181/150, 148
See application file for complete search history.

(56) References Cited

U.S. PATENT DOCUMENTS

| | | | | |
|---|---|---|---|---|
| 5,206,464 | A * | 4/1993 | Lamm et al. | 181/150 |
| 5,970,158 | A | 10/1999 | Beltran | |
| 8,023,664 | B2 * | 9/2011 | Yang | 381/87 |
| 8,256,728 | B2 * | 9/2012 | Wright | 248/221.11 |
| 8,286,749 | B2 * | 10/2012 | Stewart et al. | 181/150 |
| 8,297,402 | B2 * | 10/2012 | Stewart et al. | 181/152 |
| 8,403,107 | B2 * | 3/2013 | Stewart et al. | 181/150 |
| 8,443,930 | B2 * | 5/2013 | Stewart et al. | 181/148 |
| 8,479,871 | B2 * | 7/2013 | Stewart et al. | 181/152 |
| 2001/0030078 | A1 * | 10/2001 | Jones et al. | 181/150 |
| 2003/0123679 | A1 * | 7/2003 | Dudleston et al. | 381/87 |
| 2004/0179710 | A1 * | 9/2004 | Farinelli et al. | 381/386 |
| 2007/0121988 | A1 * | 5/2007 | Merrey et al. | 381/386 |

FOREIGN PATENT DOCUMENTS

CN 1236466 A 11/1999

* cited by examiner

*Primary Examiner* — Forrest M Phillips

(74) *Attorney, Agent, or Firm* — The Hecker Law Group, PLC

(57) ABSTRACT

The present invention comprises a method and apparatus for installing a tile-mounted ceiling speaker that combines the ease of installation of a lay-in speaker system with the visual appearance of a tile-mounted speaker system. In one or more embodiments, the apparatus of the present invention includes a support frame, back box assembly configured for installation on top of a ceiling tile, a ceiling ring configured to be mounted in an opening in a ceiling tile, and a loudspeaker cartridge configured to be mounted to the support frame through the ceiling tile opening.

10 Claims, 21 Drawing Sheets

CEILING LOUDSPEAKER SUPPORT SYSTEM

CROSS-REFERENCE TO RELATED APPLICATIONS

This patent application is a continuation in part of U.S. patent application Ser. No. 13/161,022 filed Jun. 15, 2011, which is a continuation in part of U.S. patent application Ser. No. 13/159,801 filed Jun. 14, 2011, issued as U.S. Pat. No. 8,286,749 on Oct. 16, 2012, which is a continuation in part of U.S. patent application Ser. No. 12/795,218 filed Jun. 7, 2010, issued as U.S. Pat. No. 8,109,360 on Feb. 7, 2012, which is a continuation in part of U.S. patent application Ser. No. 12/355,730 filed Jan. 16, 2009, issued as U.S. Pat. No. 7,866, 438 on Jan. 11, 2011, which is a continuation-in-part of U.S. patent application Ser. No. 12/163,929 filed Jun. 27, 2008, issued as U.S. Pat. No. 7,861,825 on Jan. 4, 2011, all of which are incorporated by reference in their entirety herein.

BACKGROUND OF THE INVENTION (1) Field of the Invention

The present invention relates to a loudspeaker support system for mounting in a suspended ceiling comprising a support frame, back box assembly and a sealing ring.

(2) Background of the Invention

Suspended ceilings, consisting of ceiling tiles supported by a grid of t-bar frames, are common in business as well as in some residential environments. It is often desired to mount loudspeakers in suspended ceilings to provide for communications and/or entertainment. Consequently, various types of loudspeaker systems have been developed for installation in suspended ceilings.

One type of prior art ceiling loudspeaker system consists of a loudspeaker mounted to a conventional ceiling tile. A hole is cut in the ceiling tile to accommodate the speaker, and the speaker is mounted to the tile over, in, or adjacent to the hole. The size of speaker that can be used in this type of loudspeaker system is limited because conventional ceiling tiles have limited structural strength and in some cases are rated by the manufacturers as having no structural strength at all. FIG. 1 shows a modification of this type of ceiling loudspeaker system that adds a support frame that provides additional support for the loudspeaker. As shown in FIG. 1, the support frame includes support bars 105 and 110 that extend across the back of a ceiling tile 115 to t-bar frames (such as t-bar frame 120) that support the ceiling tile, and a support ring 125 that is mounted to support bars 105 and 110 adjacent to the hole 130 in ceiling tile 115. The speaker is mounted on support ring 125 so that some or all of the weight of the speaker is supported by the support bars and ring and not just the speaker tile, allowing a heavier speaker to be used. The speaker can be a single speaker or can be a speaker assembly that includes multiple speakers. A further modification of this type of ceiling loudspeaker system adds a metal "can" to the back of the speaker assembly that is intended to comply with fire codes for plenum installations.

An example of a ceiling speaker assembly that includes a back can and that is intended to be mounted in a ceiling tile using a support frame like that shown in FIG. 1 is the SI 26CT model ceiling speaker sold by Extron Electronics, which is shown in FIG. 2. As shown in FIG. 2, the SI 26CT ceiling speaker assembly 200 includes a woofer 205 with a coaxially mounted tweeter 210 mounted to a speaker frame 215. A metal back can 220 is mounted to the back of speaker frame 215 forming a chamber that encloses the back side of woofer 205. A removable panel in the back of metal back can 220 (not shown) provides access for electrical connections to the speaker unit. A crossover circuit may also be mounted to the rear of woofer 205. Internal speaker wires lead from the crossover circuit to each of woofer 205 and tweeter 210. To improve the acoustic response, a port 225 is formed in speaker frame 215. A plurality of mounting doglegs (sometimes referred to herein as "dogs" or "flip dogs") 230 are attached to the rear of speaker frame 215. To mount speaker assembly 200 onto a ceiling tile, an appropriate hole is cut into the ceiling tile. A support frame such as that shown in FIG. 1 is installed on top of the ceiling tile. The rear of speaker assembly 200 is inserted into the hole in the ceiling tile from the bottom until speaker frame 215 is flush against the bottom surface of the ceiling panel. Mounting dogs 230 are then pivoted such that the ends of their doglegs are disposed over the support ring on the back side of the ceiling tile, thereby securing speaker assembly 200 to the ceiling tile and support frame.

Another type of ceiling speaker is a "lay-in" ceiling speaker, an embodiment of which is disclosed, for example, in U.S. Pat. No. 6,944,312 issued to Mason et al. entitled "Lay-In Ceiling Speaker." The lay-in speaker disclosed in Mason et al. is intended to replace an entire ceiling tile. It consists of a speaker mounted to a perforated metal grille, which is crimped to a fiberglass back box, forming a generally rigid loudspeaker assembly that has the same lateral dimensions as a standard ceiling tile and that can be mounted in a suspended ceiling simply by removing an existing ceiling tile and putting the "lay-in" loudspeaker assembly in its place, the edges of the "lay-in" speaker resting on the t-bar support frames of a suspended ceiling in the same manner as a ceiling tile. When installed, the visual appearance of a lay-in speaker is that of a perforated grill having the size and shape of a ceiling tile.

Although lay-in speakers are easy to install, sometimes the visual appearance of a tile-mounted ceiling speaker is preferred over the appearance of a lay-in speaker. Until now, there has been no ceiling speaker assembly that combines the ease of installation of a lay-in speaker with the aesthetics of a tile-mounted ceiling speaker.

BRIEF SUMMARY OF THE INVENTION

The present invention comprises a method and apparatus for installing a tile-mounted ceiling speaker that combines the ease of installation of a lay-in speaker system with the visual appearance of a tile-mounted speaker system. In one or more embodiments, the apparatus of the present invention includes a support frame, back box assembly configured for installation on top of a ceiling tile, a ceiling ring configured to be mounted in an opening in a ceiling tile, and a loudspeaker cartridge configured to be mounted to the support frame through the ceiling tile opening. In one or more embodiments, the method of the present invention comprises forming an appropriately-sized hole in a ceiling tile, laying an integrated back box and support frame on top of the ceiling tile, placing a sealing ring in the hole in the ceiling tile, connecting wires from an external audio source to terminals provided at the back box, connecting wires provided on the inside of the back box to a loudspeaker cartridge, inserting the loudspeaker cartridge into the hole in the ceiling tile from below, fastening the loudspeaker cartridge to the support frame, and fastening a grille to the loudspeaker cartridge. In one or more embodiments, a variety of interchangeable loudspeaker cartridges having differing loudspeaker configurations are provided. In one or more embodiments, the support frame and back box assembly is configured to allow installation of more than one loudspeaker cartridge. In one or more embodiments, the loudspeaker cartridges are configured for use both with a back box and without back box.

BRIEF DESCRIPTION OF THE DRAWINGS

The present invention may be understood and its features made apparent to those skilled in the art by referencing the accompanying drawings.

DETAILED DESCRIPTION OF THE INVENTION

In the following description, numerous specific details are set forth to provide a more thorough description of the present invention. It will be apparent, however, to one skilled in the art, that the present invention may be practiced without these specific details. In other instances, well-known features have not been described in detail so as not to obscure the invention.

Figure 3:
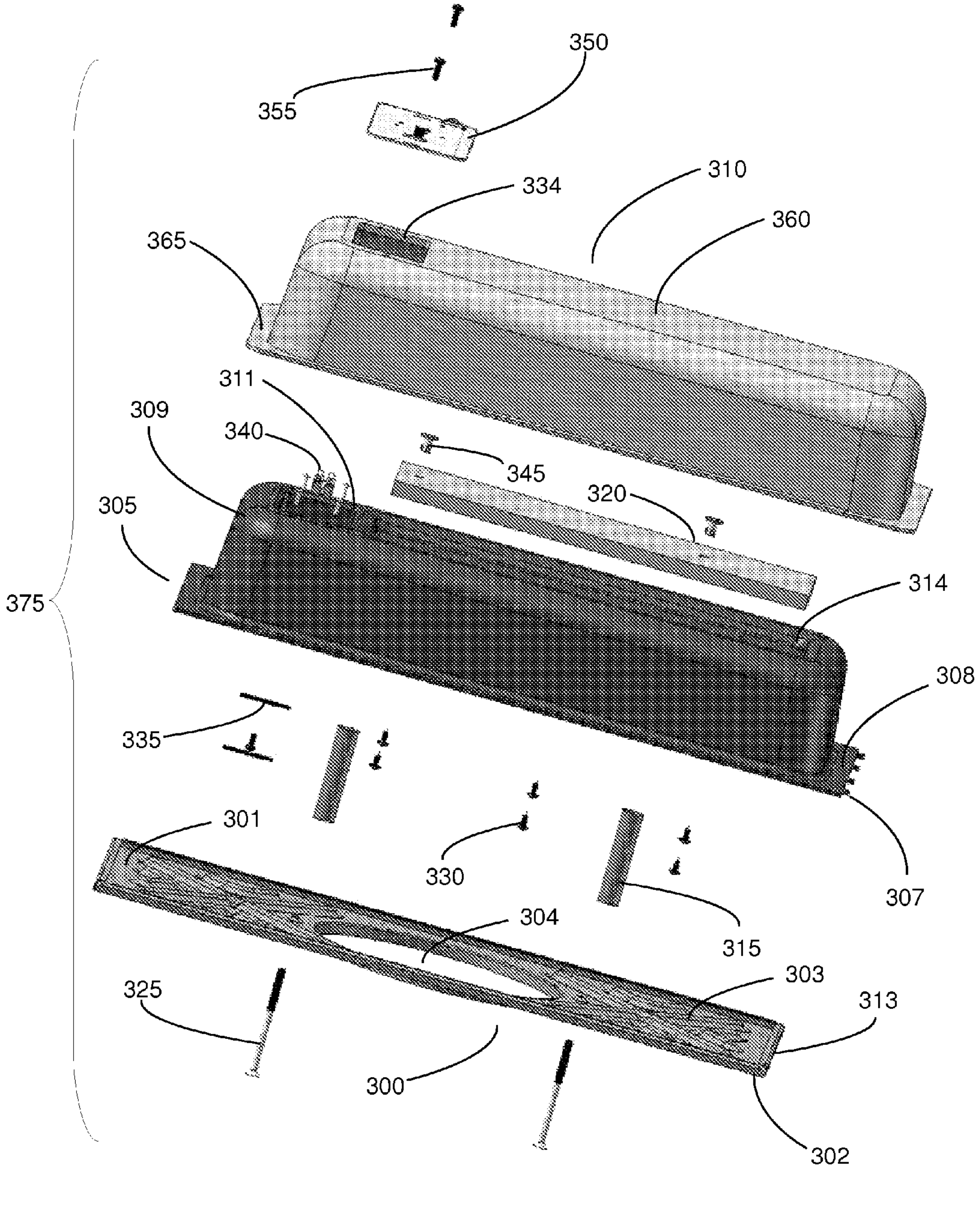
FIG. 3 is an exploded perspective view of an embodiment of a support frame and back box assembly of the present invention.

FIG. 3 is an exploded view showing components of a support frame and back box assembly 375 of an embodiment of the present invention. In the embodiment of FIG. 3, components of support frame and back box assembly 375 include a support frame 300, a back box 305, and an outer shield 310.

In the embodiment of FIG. 3, support frame 300 comprises a metal, plastic, or other material or materials formable into the desired shape and form. In one or more embodiments, support frame 300 is formed as a sheet metal stamping. In the embodiment of FIG. 3, support frame 300 includes a planar portion 301, an opening 304 (which in one or more embodiments is surrounded by an inside lip 306), a plurality of stiffening ribs 303 (which can have any of a desired configuration, including longitudinal ribs parallel to the width or length of support frame 300, ribs having the general form shown in FIG. 3, or any other configuration, shape and size), and an outside lip 302. In one or more embodiments, outside lip is initially formed at an approximately right angle to planar portion 301. In one or more embodiments, support frame 300 is formed from a sheet of material. In alternative embodiments, stiffening ribs 303 and/or outside lip 302 and/or inside lip 306 may not be integrally formed with planar portion 301, but may comprise separately formed components that are affixed to planar portion 301 to form support frame 300. In the embodiment of FIG. 3, support frame 300 comprises a single centrally-located round opening 304 for receiving a speaker or a speaker cartridge. In one or more other embodiments, support frame 300 may comprise two or more openings for receiving speakers or speaker cartridges. The openings may have the same or different shapes (round, rectangular or other) and sizes, and may each be located anywhere in speaker frame 300. Further, planar portion of speaker frame 300 need not be formed from a single piece of material, but may be assembled from separately formed pieces. Further, although speaker frame 300 is shown as having a generally rectangular shape, any other desired shape can be used.

Figure 14A:
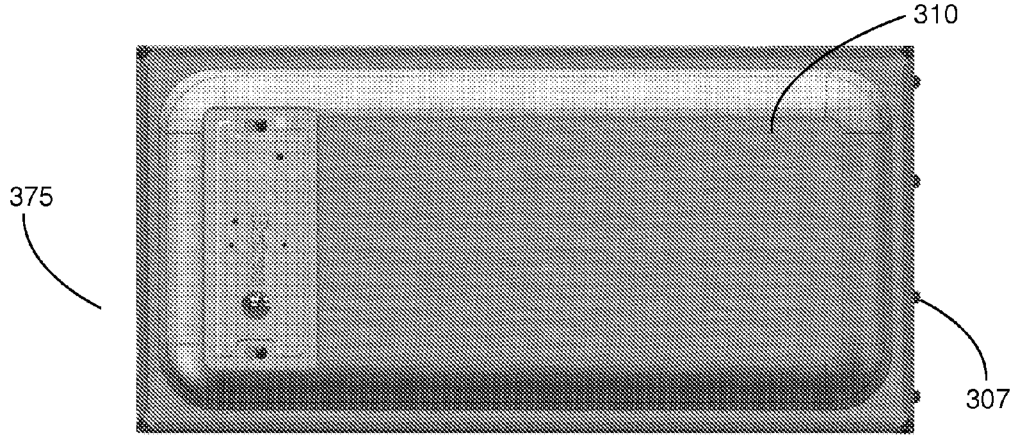
FIGS. 14A-14C show removable spacer tabs of one or more embodiments of the present invention.
Figure 14B:
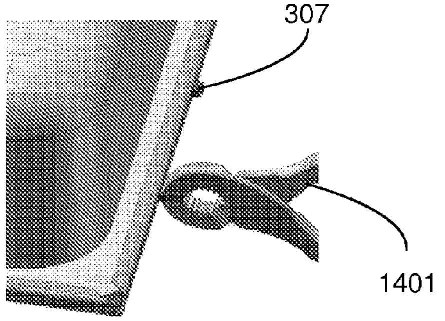
Figure 14C:
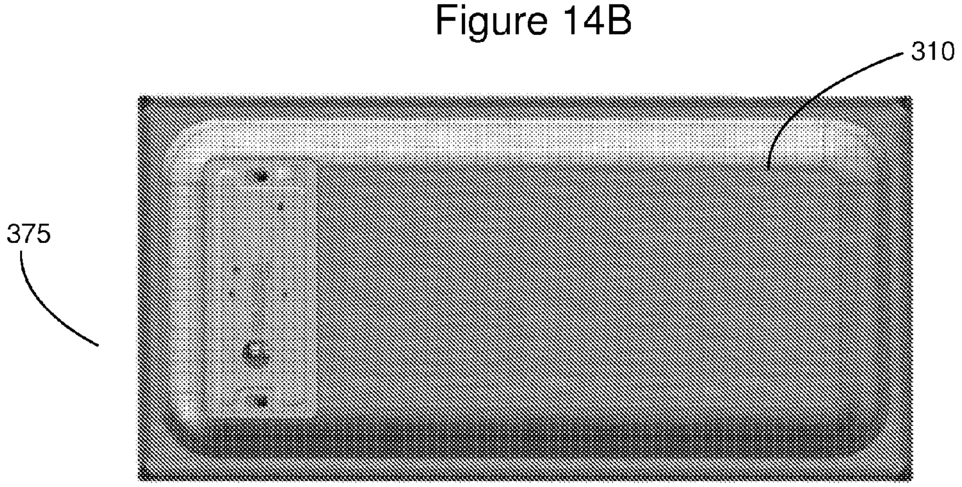
Figure 15:
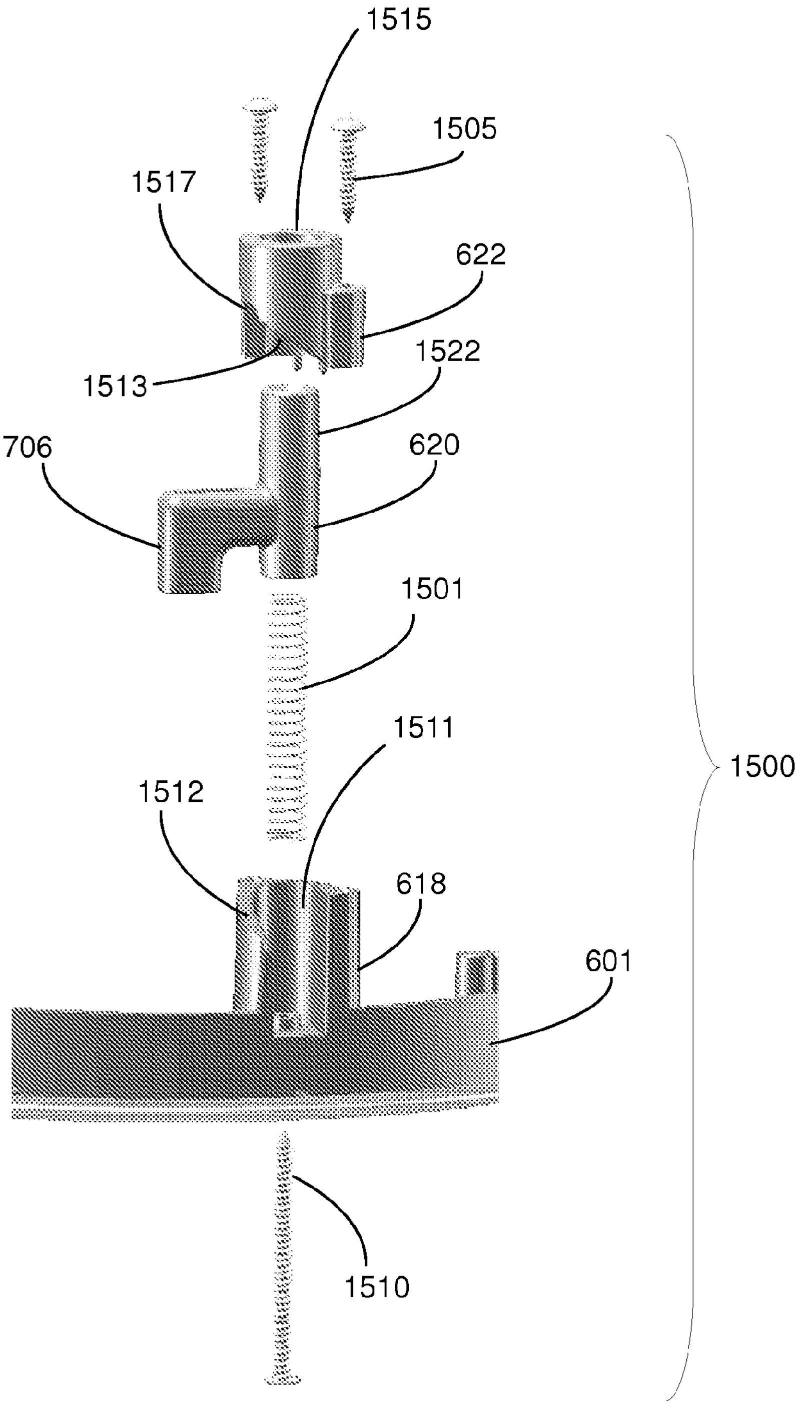
FIG. 15 is an exploded view of a “flip dog” assembly of one or more embodiments of the present invention.

In the embodiment of FIG. 3, back box 305 comprises a raised portion 309 and an edge portion 308. In one or more embodiments, edge portion 308 comprises a plurality of spacer tabs 307 that allow the overall length of back box 305 to be adjusted so that support frame and back box assembly 375 can be used with a plurality of ceiling t-bar spacings. In one or more embodiments, the overall length of support frame and back box assembly 375 with spacer tabs 307 intact is approximately 2 feet, which is a standard width for ceiling tiles in the United States. In one or more embodiments, with spacer tabs 307 removed (for example by breaking off with a tool such as a pair of pliers), the overall length of support frame and back box assembly 375 is approximately 600 mm, which is a standard width for ceiling tiles in some European countries. FIGS. 14A-14C illustrate how spacer tabs 307 may be removed (for example with pliers 1401 as shown in FIG. 14B) to create two different overall lengths for support frame and back box assembly 375. Although spacer tabs 307 are shown as all having the same length and disposed along only one side of support frame and back box assembly 375, in one or more alternative embodiments, spacer tabs may be included on other sides. Further, two or more sets of spacer tabs having different lengths may be used along one or more sides, providing additional discrete, selectable variations of overall lengths and/or widths for support frame and back box assembly 375 depending on which tabs are removed. In one or more embodiments, spacer tabs are scored or notched to facilitate removal of the tabs.

In one or more embodiments, back box 305 is formed from high molecular weight polyethylene ("HMWPE"), though back box 305 can be formed from any other plastic, metal, or composite material or materials. In one or more embodiments, back box 305 comprises a recessed portion 314 that is configured to accommodate a stiffening plate 320 to provide additional structural rigidity. In one or more embodiments, stiffening plate 320 is made from a relatively stiff material, such as medium density fiberboard ("MDF"). The use of stiffening plate 320 allows support frame and back box assembly 375 to have significant rigidity (which is desirable for improved acoustical response) yet be relatively light in weight. Stiffening plate 320 also improves bass response by adding material density to back box 305 and reducing deflection of back box 305. In one or more embodiments, back box 305 comprises a recessed electrical compartment 311 that includes electrical terminals 340 for making external electrical connections.

In the embodiment of FIG. 3, outer shield 310 is configured to be mountable over back box 305 such that the inside surface of outer shield 310 conforms generally to the outside surface of back box 305. In one or more embodiments, outer shield 310 includes a raised portion 360 and an edge portion 365. In one or more embodiments, outer shield 310 is formed from materials as is known in the art that provide fire and heat resistance in conformity with applicable building codes. In one or more embodiments, outer shield 310 comprises a composite construction comprising an inner mineral fiber or fiberglass shell and an outer metal foil layer. In one or more embodiments, outer shield 310 conforms to the Underwriters' Laboratories UL2043 rating. In one or more embodiments, outer shield 310 includes an opening 334 that is configured to provide access to electrical compartment 311 of back box 305 when outer shield 310 is assembled to back box 305 and support frame 300. In one or more embodiments, outer shield 310 is provided with a pair of plates 335 comprising threaded holes that can be used to mount a cover plate 350 over opening 334 using fasteners 355.

In the embodiment of FIG. 3, support frame 300, back box 305, stiffening plate 320 and outer shield 315 are assembled together to form an an embodiment of a support frame and back box assembly of the invention. In one or more embodiments, stiffening plate 320 is fastened to back box 309 using a plurality of screws 330. Back box 305 is fastened to support frame 300 and stiffening plate 345 using bolts 325, spacers 315 and barrel nuts 345. In one or more embodiments, when assembled, the components work together to form an assembly that has a rigidity greater than the rigidity of the individual components. In one or more embodiments, spacers 315 act as stiffeners that, together with bolts 325 and barrel nuts 345, mechanically tie support frame 300 and back box 305 together, reducing any bellows effect of the enclosure formed by support frame 300 and back box 305. In one or more embodiments, spacers 315 are formed from a plastic, a metal, or any other material or combination of materials.

In one or more embodiments, outside lip of support frame 300 includes openings 313 through which spacer tabs 307 of back box 305 protrude when back box 305 is mounted to support frame 300.

Figure 4:
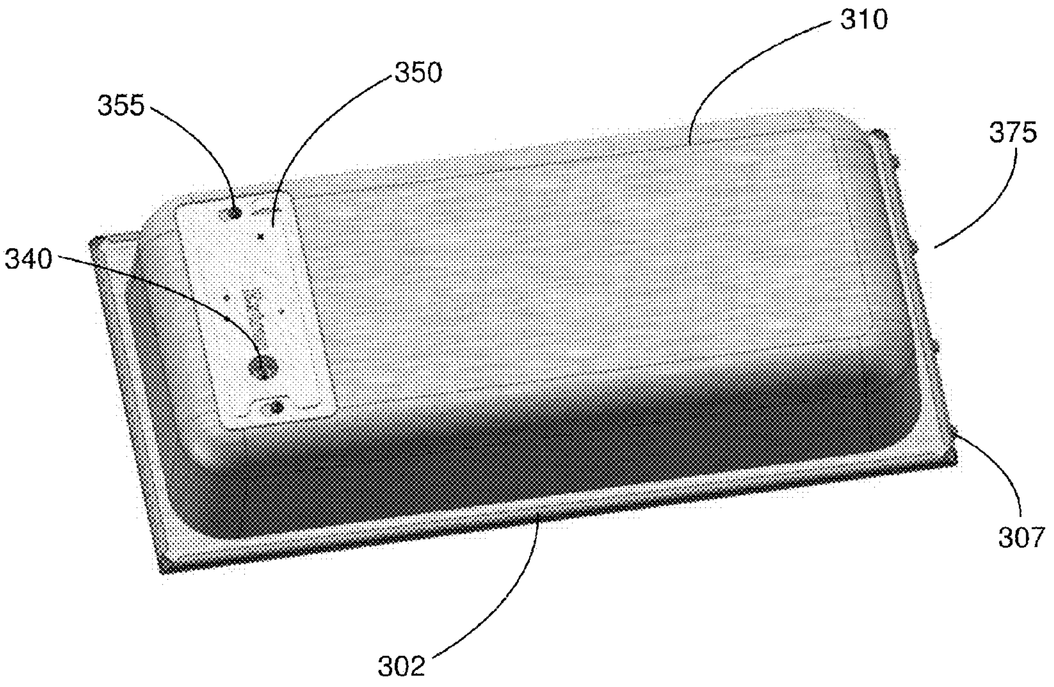
FIG. 4 is a rear perspective view of an embodiment of a support frame and back box assembly of the present invention.
Figure 5:
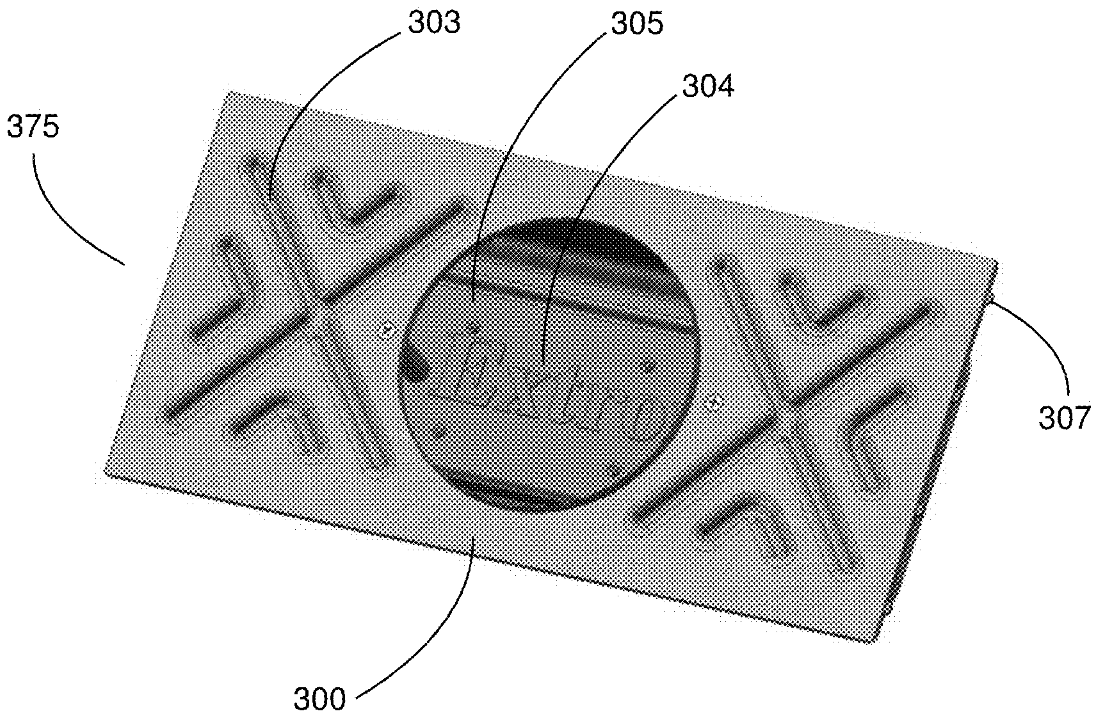
FIG. 5 is a front perspective view of an embodiment of a support frame and back box assembly of the present invention.

In the embodiment of FIG. 3, after back box 305 is assembled to support frame 300, outer shield 310 is placed over back box 305 such that edge portion 365 of outer shield 310 rests on edge portion 308 of back box 305. In one or more embodiments, outside lip of support frame 300 is thereafter folded over edge portion 365 of outer shield 310 such that outside lip holds outer shield 310 in place, as shown in FIG. 4, which shows a top view of an embodiment of a resulting support frame and back box assembly 375 of the invention. A bottom view of support frame and back box assembly 375 is shown in FIG. 5. In one or more embodiments, additional or other fastening methods and/or fasteners may be used to fasten support frame 300 and/or back box 305 to outer shield 310 as will be known to those of skill in the art. For example, in one or more embodiments, spring-loaded or folded clips may be used to hold outer shield 310 to support frame 300 and back box 305.

Figure 6:
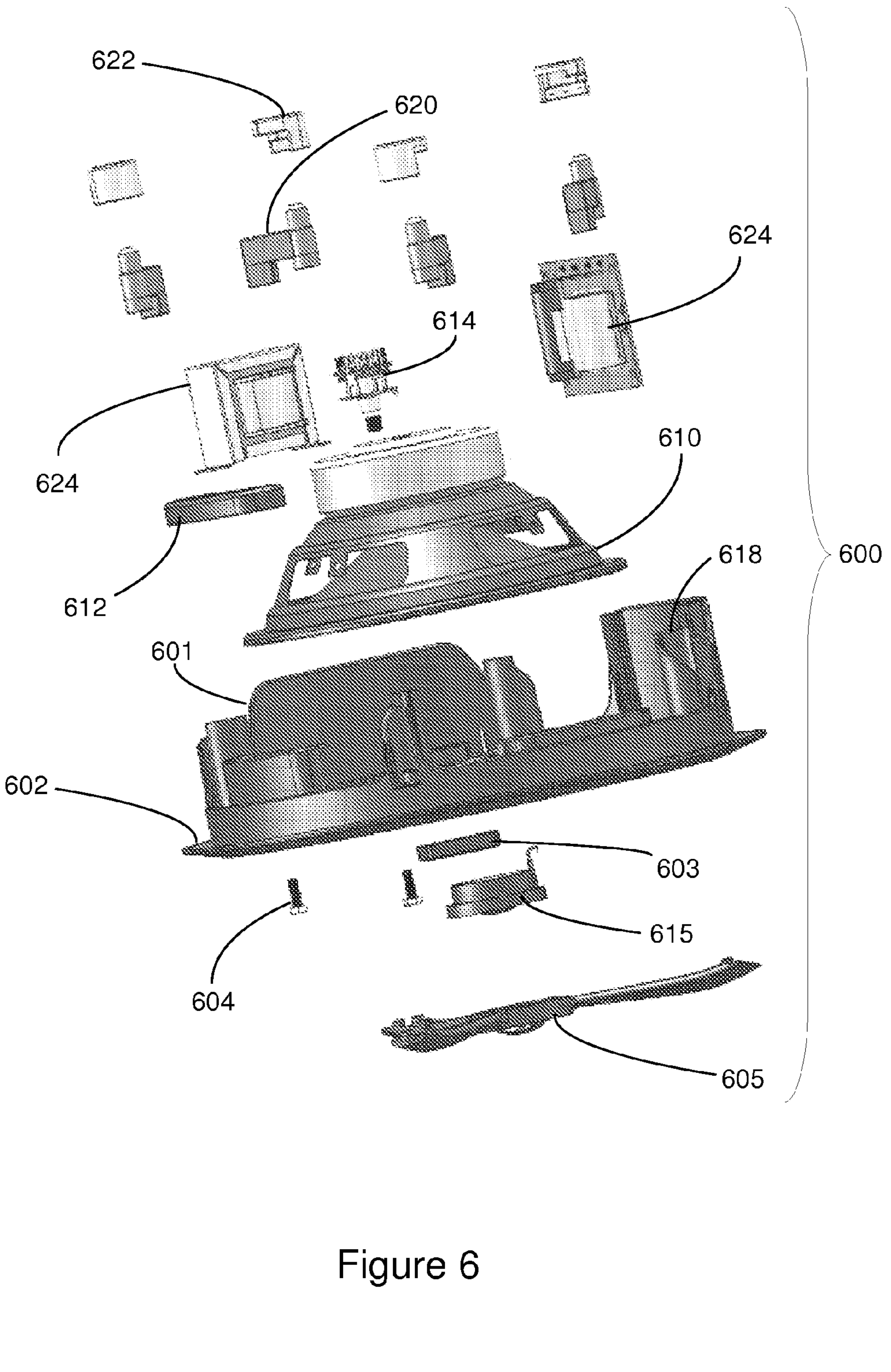
FIG. 6 is an exploded perspective view of an embodiment of a speaker cartridge of the present invention.
Figure 7:
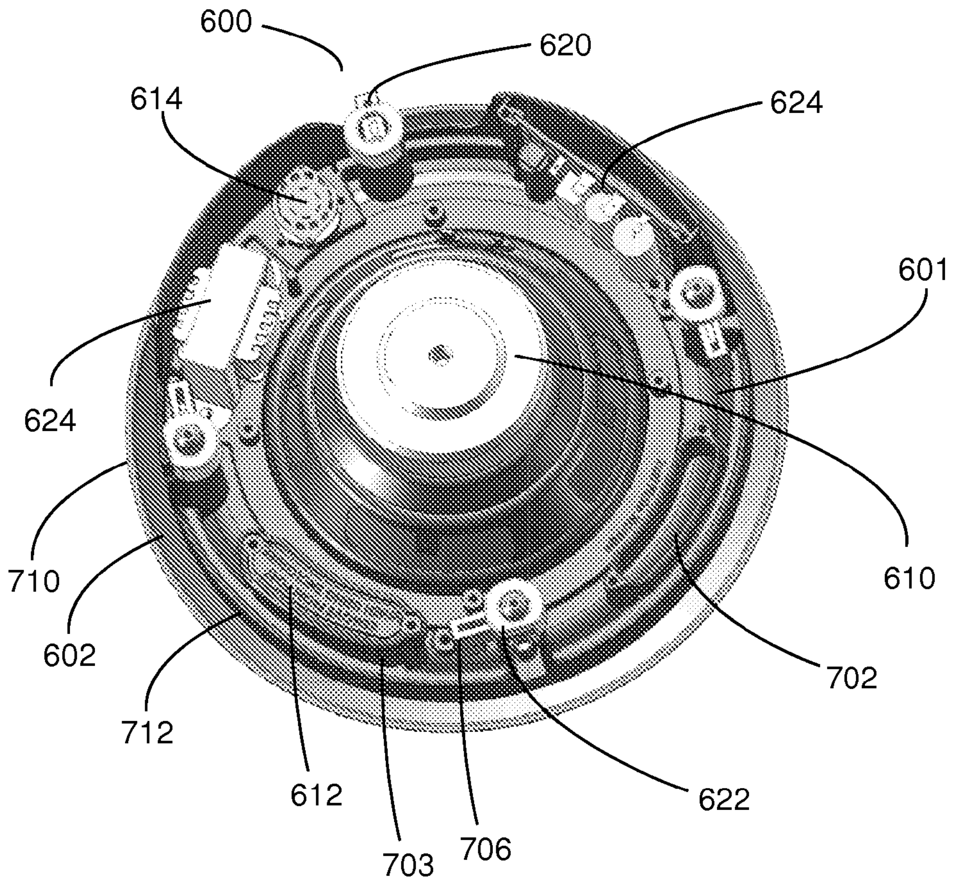
FIG. 7 is a rear perspective view of an embodiment of a speaker cartridge of the present invention.
Figure 8:
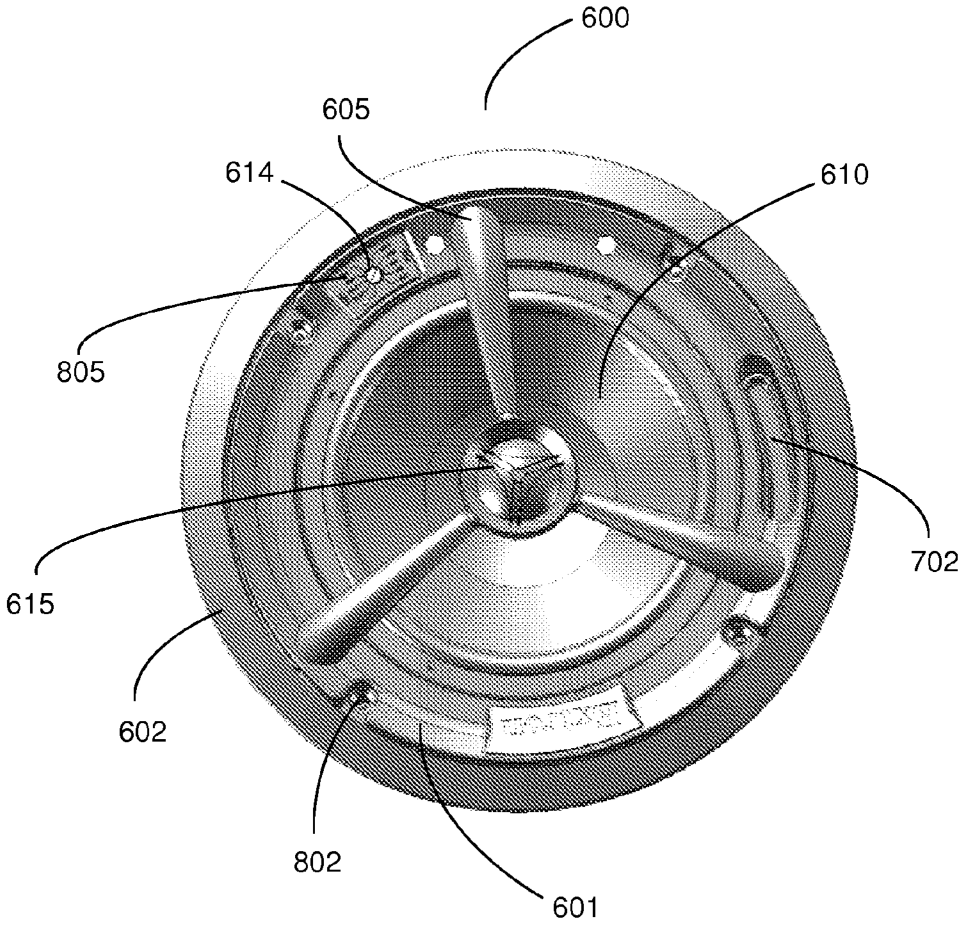
FIG. 8 is a front view of an embodiment of a speaker cartridge of the present invention.

An embodiment of a speaker cartridge 600 of the invention which may be used independently of or with a support frame and back box assembly such as support frame and back box assembly 375 is shown in FIGS. 6, 7 and 8. FIG. 6 is an exploded view showing components of an embodiment of speaker cartridge 600. FIGS. 7 and 8 are top and bottom views, respectively, of embodiments of an assembled speaker cartridge 600.

In the embodiment of FIG. 6, speaker cartridge 600 comprises a cartridge frame 601 to which various components are mounted. In one or more embodiments, cartridge frame 601 is molded from a plastic, cast from a metal, or formed in any other manner as will be known by those of skill in the art. In one or more embodiments, cartridge frame 601 is molded from HMWPE. In one or more embodiments, cartridge frame 601 is formed to fit into opening 304 of support frame 300. In one or more embodiments, cartridge frame 601 includes a flange 602. In one or more embodiments, cartridge frame 601 provides mounting locations for components that are intended to be mounted to cartridge frame 601. In the embodiment of FIG. 6, components mounted to cartridge frame 601 include a speaker 610, a tweeter 615, a tweeter bracket 605, a transformer 624, a switch 614, a crossover circuit board 624, and a plurality of "flip dog" attachment clips each comprising a flip dog base 618 (which may, for example, be integrally formed with cartridge frame 601), rotatable flip dog 620 and a flip top cap 622. In one or more embodiments, speaker 610 is a midrange speaker or a woofer. In one or more embodiments, transformer 624 is configured to match an incoming audio signal to the signal requirements of speaker 610. In one or more embodiments, transformer 624 has multiple taps that can be selected by switch 614 so that speaker cartridge 600 can be used with a variety of input signal configurations.

In the embodiment of FIG. 6, crossover circuit board 624 includes a conventional crossover circuit that divides the incoming audio into primarily lower frequency signals that are sent to speaker 610 and primarily higher frequency signals that are sent to tweeter 615, as is known in the art.

FIG. 7 shows how components are assembled to cartridge frame 601 in one or more embodiments of the invention. In the embodiment shown in FIG. 7, a portion of cartridge frame 601 that is configured to fit within opening 304 of support frame 300 has an inner perimeter 712 that has a diameter equal to or less than the diameter of opening 304. Flange 602 extends outwards from perimeter 712 to an outer perimeter 710 that has a diameter greater than the diameter of opening 304 of support frame 300. In the embodiment of FIG. 6, flip dogs 620 are rotatably mounted to flip dog bases 618 such that legs 706 of flip dogs 620 can be rotated from an inward position in which they do not extend beyond inner perimeter 712 and can therefore be inserted into opening 304 of support frame 300 to an outward position in which they extend beyond inner perimeter 712 so as to extend over the perimeter of opening 304 so as to hold speaker cartridge 600 in place adjacent to support frame 300 when speaker cartridge 600 is assembled to support frame and back box assembly 375. In one or more embodiments, flip dogs 620 and flip dog bases 618 are configured such that the rotational position of flip dogs 620 can be manipulated from the bottom side of cartridge frame 601, for example by use of a tool such as a screwdriver. In one or more embodiments, switch 614 is also configured so as to allow operation of switch 614 from the bottom of cartridge frame 601.

In the embodiment of FIG. 7, cartridge frame 601 includes a port 703, a removable port cover 612, and a port cover storage location 702. When mounted to a support frame and back box assembly such as support frame and back box assembly 375, port cover 612 may be removed and stored in port cover storage location 702 so that port 703 functions like a conventional speaker port, providing a path between the outside and inside of the speaker enclosure formed by the combination of speaker cartridge 600 and support frame and back box assembly 375. In one or more embodiments, leaving port 703 covered provides better audio response if speaker cartridge 600 is mounted in a ceiling tile or otherwise used in a manner in which the rear of speaker cartridge 600 is not enclosed by a back box or other housing.

FIG. 8 shows a bottom view of one or more embodiments of speaker cartridge 600. In the embodiment of FIG. 8, tweeter bracket 605 has been mounted to cartridge frame 601, for example by engaging tabs at the ends of the legs of tweeter bracket 605 with mating slots in cartridge frame 601. In one or more embodiments, tweeter bracket 605 allows different tweeters to be used with speaker cartridge 600. In one or more embodiments, different tweeter brackets 605 may be interchangeably used with speaker cartridge 600. In one or more embodiments, tweeter brackets 605 may be configured to provide various assembled locations for tweeter 615 with respect to speaker 610, allowing the assembled location of a particular tweeter 615 to be configured to provide a desired acoustical interaction with speaker 610. In the embodiment of FIG. 8, cartridge frame 601 includes orifices 802 that provide access to flip dogs 620 with an appropriate tool, such as, for example, a screwdriver, that can be used to rotate flip dogs 620 from a retracted position (in which the legs 706 do not interfere with insertion of speaker cartridge 600 into opening 304 of support frame 300) to an extended position (in which legs 706 extend beyond opening 304 of support frame 300). In one or more embodiments, cartridge frame 601 also includes an opening 805 that provides access to switch 614.

FIGS. 15 to 18 show details of a flip dog assembly 1500 of one or more embodiments of the invention. In the embodiment shown in FIG. 15, components of flip dog assembly 1500 include bottom screw 1510, flip dog base 618 (which may be integrally formed with cartridge frame 601), spring 1501, flip dog 620 (which includes leg 706), flip dog cap 622, and cap screws 1505. Flip dog base 618 includes a bore 1511 and an inclined surface 1512 that together with inclined surface 1513 of flip dog cap 622 forms a guide passage for leg 706 of flip dog 620 as discussed in greater detail with respect to FIGS. 16A and 16B below.

Figure 16A:
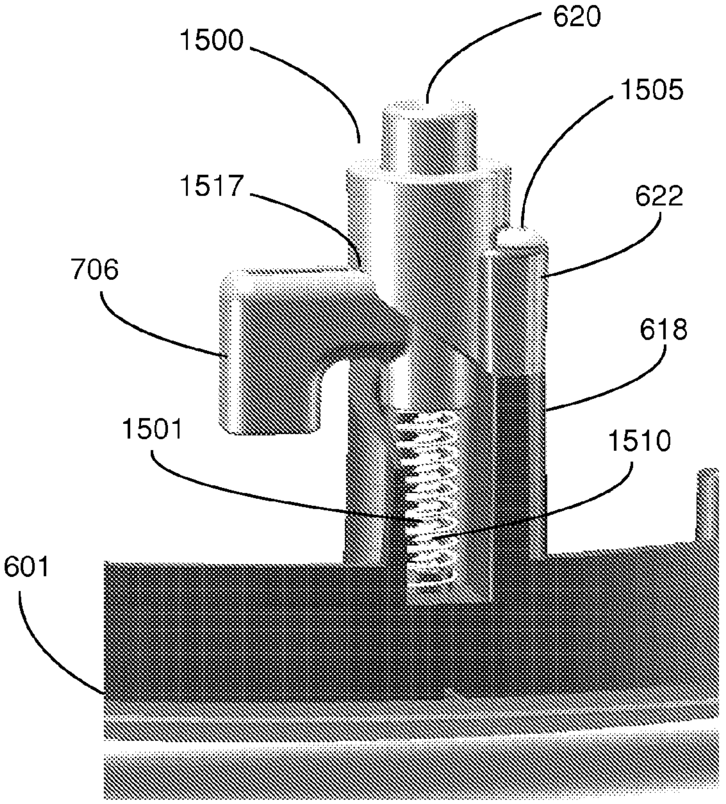
FIGS. 16A-16B show assembled “flip dog” assemblies of one or more embodiments of the present invention.
Figure 16B:
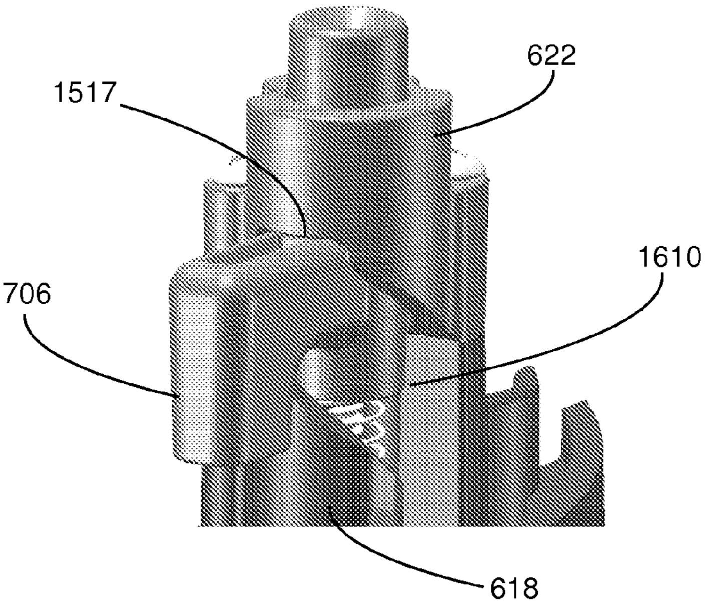

In one or more embodiments, flip dog assembly 1500 may be assembled by inserting spring 1501 and flip dog 620 in bore 1511 of flip dog base 618, placing flip dog cap 622 over flip dog 620 such that the top 1522 of flip dog 620 engages bore 1515 of flip dog cap 622, and fastening flip dog cap 622 to flip dog base 618 using cap screws 1505. Bottom screw 1510 can then be inserted through the bottom of flip dog base 618 through spring 1501 (which is now partially compressed) and partially screwed into the bottom of flip dog 620, as described in greater detail below. The resulting flip dog assembly 1500 is shown in FIGS. 16A and 16B As shown in FIGS. 16A and 16B, in one or more embodiments, flip dog cap 622 includes a notch 1517 that maintains leg 706 in its retracted position while speaker cartridge 600 is being inserted into a mounting hole (e.g. in a ceiling tile or in a support frame, such as support frame 300 of support frame and back box assembly 375). Leg 706 is pressed upwards into notch 1517 by the upwards bias of spring 1501.

Figure 17A:
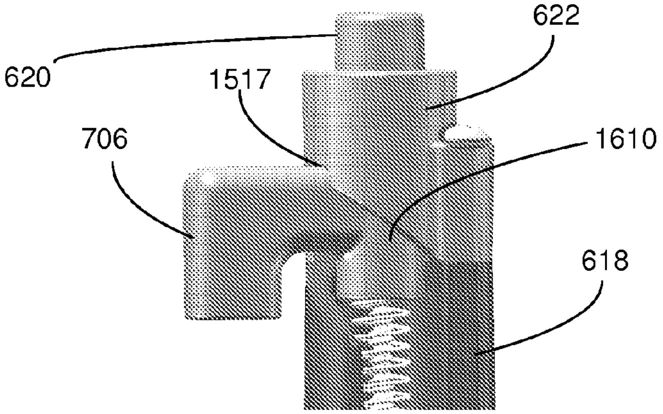
FIGS. 17A-17C illustrate a process for engaging a “flip dog” according to one or more embodiments of the present invention.
Figure 17B:
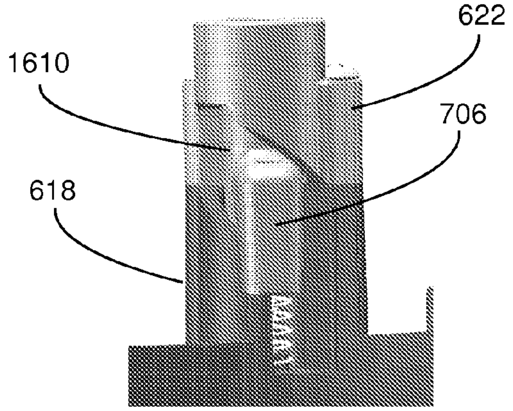
Figure 17C:
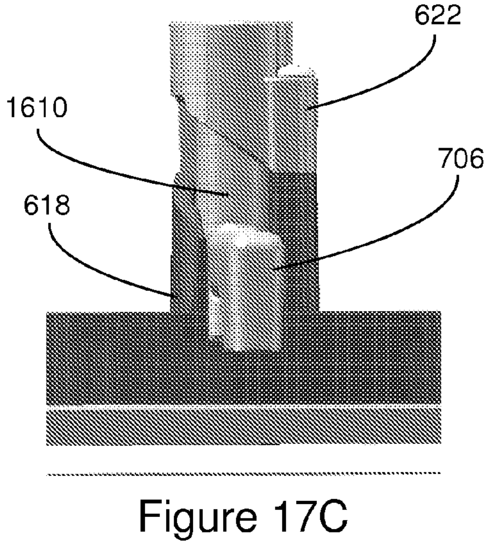

FIGS. 17A-17C show how leg 706 is moved from its retracted position as shown in FIGS. 16A and 16B to its engaged position as shown in FIG. 17C. The movement is accomplished by screwing bottom screw 1510 into the bottom of flip dog 620 such that flip dog 620 is pulled downwards into flip dog base 618 though guide passage 1610 formed by flip dog cap 622 and flip dog base 618. As shown in FIGS. 17A-17C, as flip dog 620 is pulled downwards by bottom screw 1510, the configuration of passage 1610 causes leg 706 first to disengage from notch 1517 and then to rotate outwards into its extended position as shown in FIG. 17B. Further tightening of bottom screw 1510 draws leg 706 further downwards into its fully engaged position, as shown in FIG. 17C.

Figure 18A:
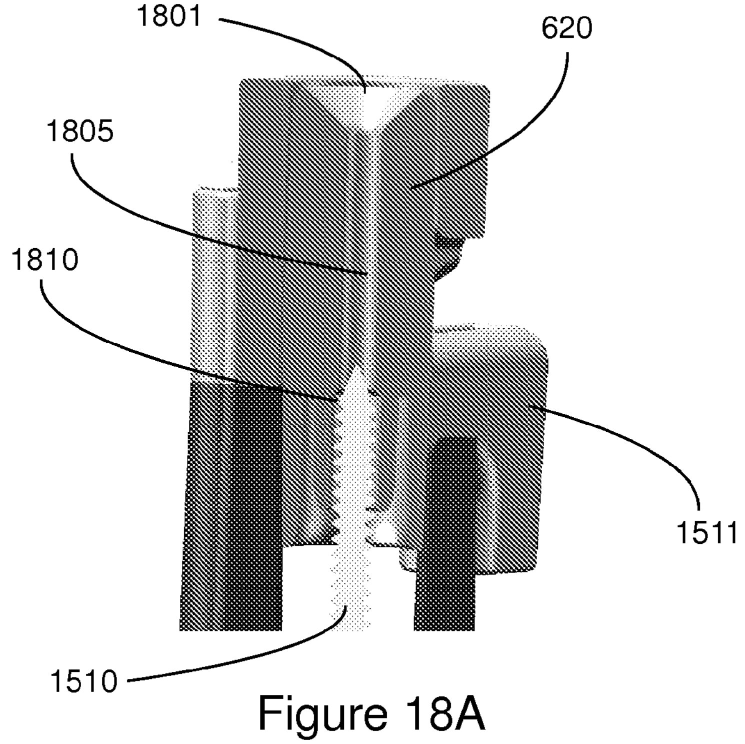
FIGS. 18A-18B show details of a screw hole of a “flip dog” of one or more embodiments of the present invention.
Figure 18B:
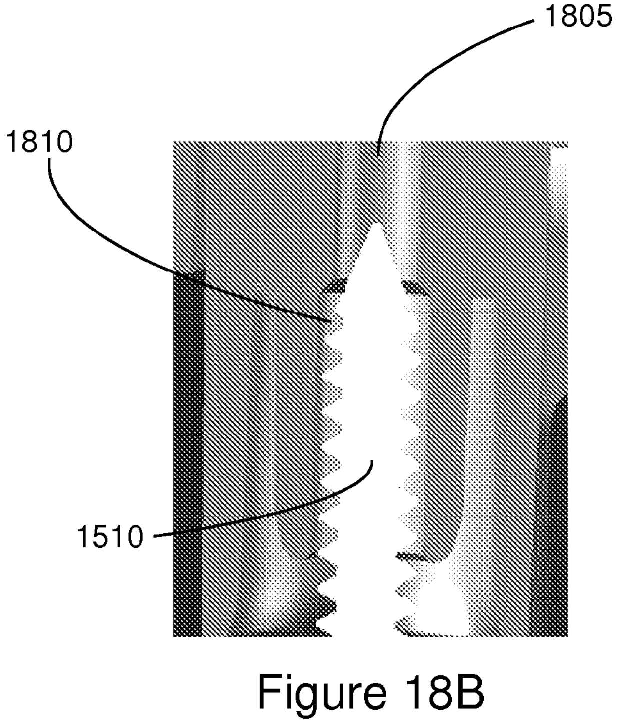

FIGS. 18A and 18B show a configuration of a screw bore 1801 in flip dog 620 in one or more embodiments of the invention. As shown in FIG. 18A, screw bore 1801 includes a guide portion 1810 that has a diameter approximately the same diameter as the outside diameter of the threads of screw 1510 and a screw engagement portion 1805 that has a diameter that is less than the outside diameter of the threads of screw 1510. Guide portion 1810 aligns bottom screw 1510 with screw engagement portion 1805 as screw 1510 is inserted into screw bore 1810, preventing screw 1510 from becoming misaligned as screw 1510 is screwed into engagement portion 1805.

Although cartridge frame 601 is shown in the embodiment of FIG. 8 to have a generally round shape that generally matches the shape of opening 304 in support frame 300, in one or more embodiments, other shapes for both cartridge frame 601 and opening 304 can be used. Further, although cartridge frame 601 of FIG. 8 is configured for a single woofer or midrange speaker and a single tweeter, in one or more other embodiments, cartridge frame 601 can be configured for multiple midrange speakers/woofers and/or multiple tweeters.

Figure 9:
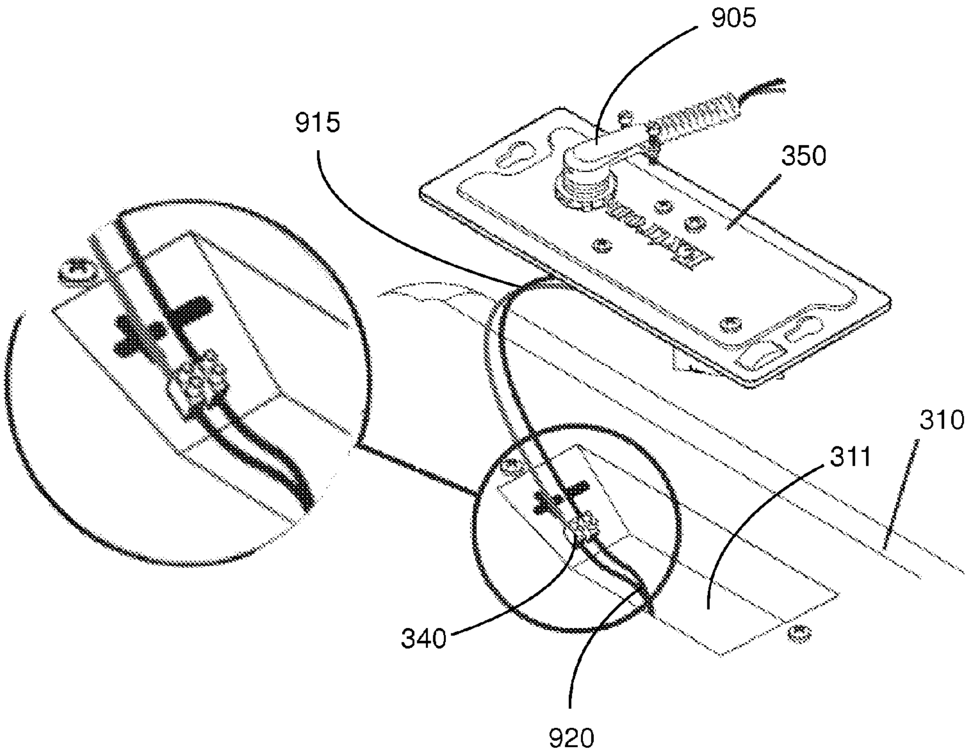
FIG. 9 is a close up view showing electrical connections for an embodiment of a back box of the present invention.

FIG. 9 shows how external wiring is connected to electrical terminals 340 of support frame and back box assembly 375 in one or more embodiments of the invention. In the embodiment shown in FIG. 9, a pair of external electrical leads 915 are fed through a conduit header 905 mounted to cover plate 350 (which has been removed to allow access) and attached to Euro-type screw electrical terminals 340 in a recessed electrical compartment 311 formed in back box 305 and accessible through opening 334 of outer shield 310. A pair of internal electrical leads 920 lead from screw electrical terminals 340 into the interior of back box 305.

Figure 10:
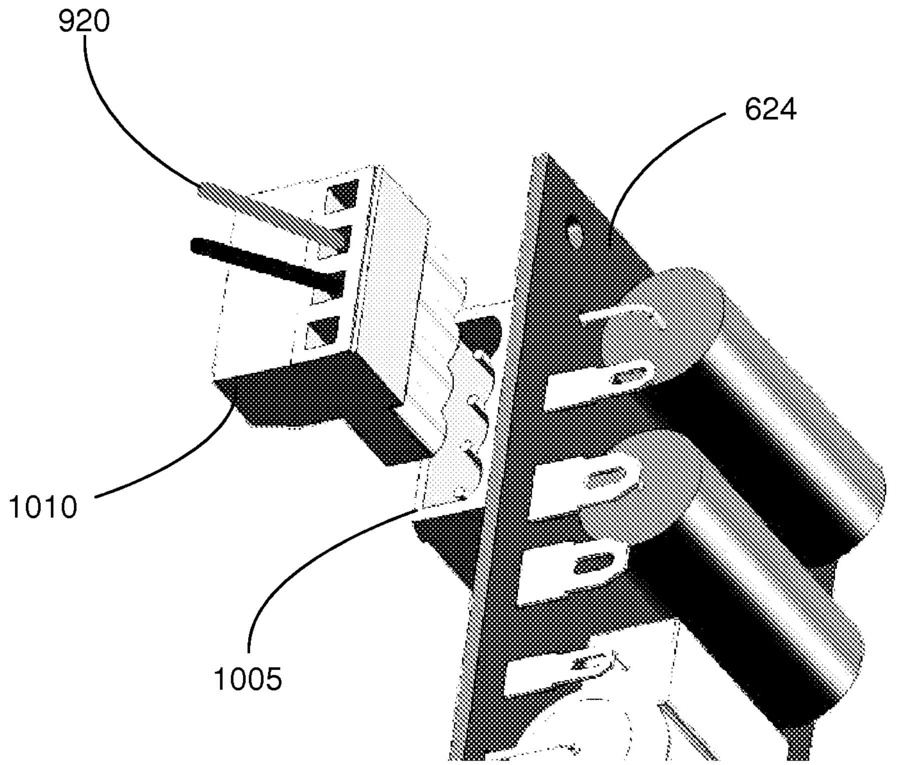
FIG. 10 is a close up view showing electrical connections for an embodiment of a speaker cartridge of the present invention.

FIG. 10 shows how internal leads 920 are connected to crossover circuit board 624 in one or more embodiments of the invention. In the embodiment of FIG. 10, internal leads 920 (which may, for example, be connected to external leads 915 via electrical terminals 340) are connected to an electrical connector 1010 (for example a Molex connector) that is configured to removably mate with a mating electrical connector 624 (for example a Molex connector) connected to crossover circuit board 624. Using removable mating connectors for connecting internal leads 920 to crossover circuit board 624 facilitates installing speaker cartridge 600 and support frame and back box assembly 375 into a suspended ceiling, as described below.

Figure 11A:
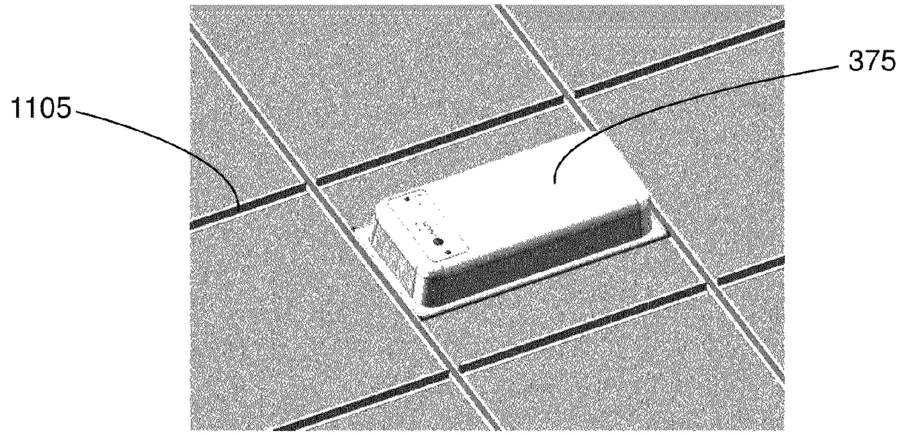
FIGS. 11A-11C show a method of mounting an embodiment of a support frame and back box assembly of the present invention.
Figure 11B:
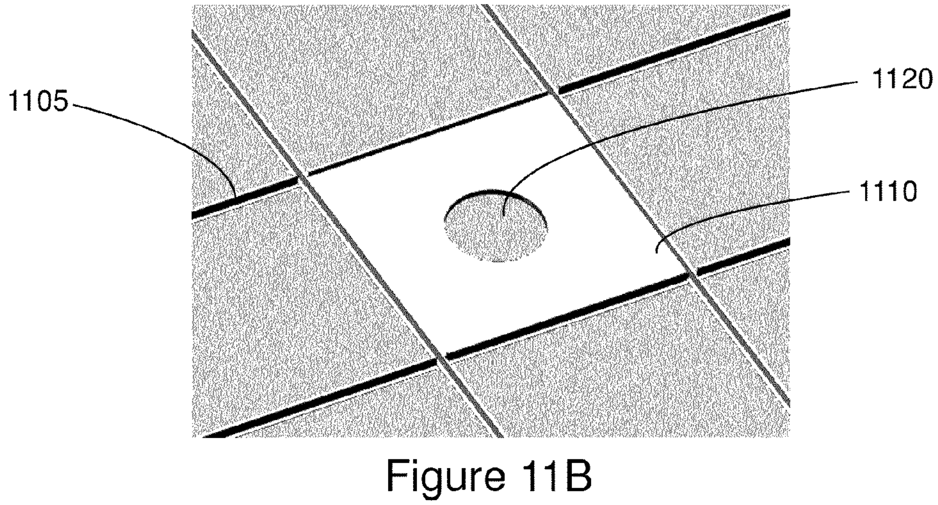
Figure 11C:
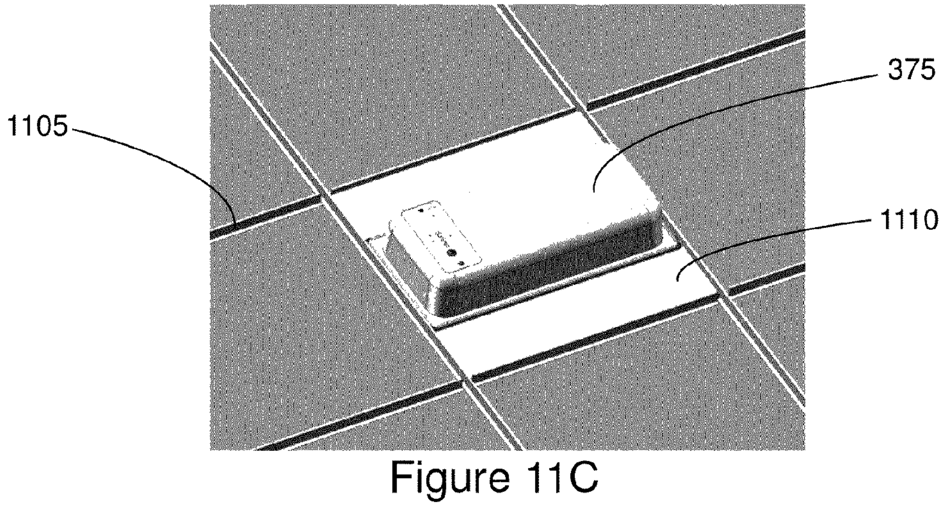

FIGS. 11A-11C illustrate steps for installing a support frame and back box assembly 375 into a suspended ceiling according to one or more embodiments of the invention. FIG. 11A shows a support frame and back box assembly 375 placed into a desired position in a grid of t-bar ceiling tile support bars 1105. FIG. 11B shows a ceiling tile 1110 placed into the same position in grid 1105 in which support frame and back box assembly 375 is shown in FIG. 11A. In FIG. 11B, an opening 1120 has been cut in ceiling tile 1110 that corresponds to the location of opening 340 of support frame 300 of support frame and back box assembly 375 of FIG. 11A. FIG. 11C shows support frame and back box assembly 375 placed in position on top of ceiling tile 1110.

Figure 12A:
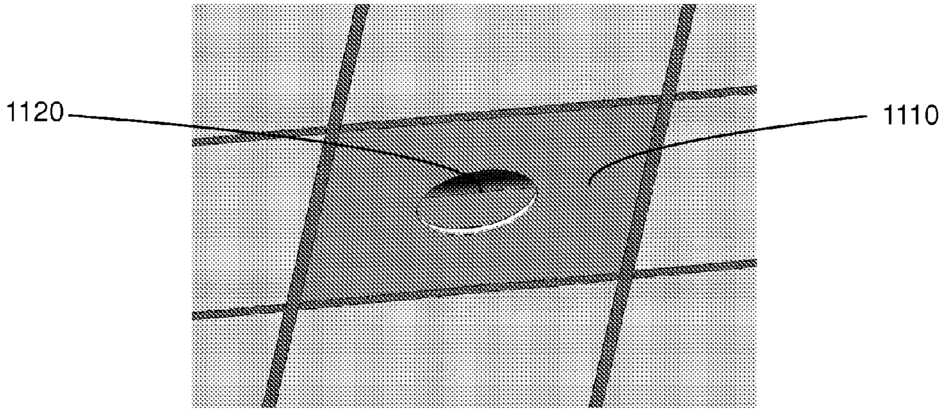
FIGS. 12A-12C show a method of mounting an embodiment of a speaker cartridge of the present invention.
Figure 12B:
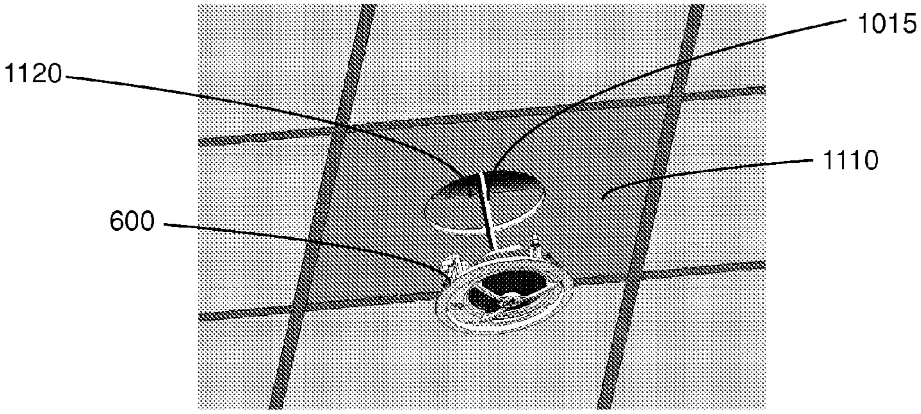
Figure 12C:
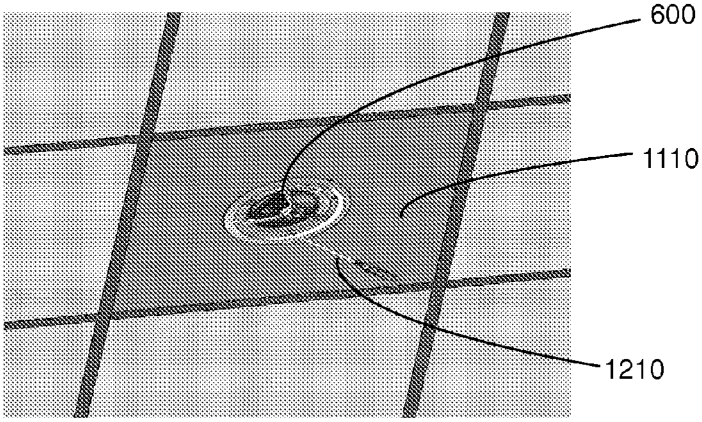

FIGS. 12A-12C illustrate steps for installing a speaker cartridge 600 into an opening 1120 of a ceiling tile 1110 with or without a support frame and back box assembly 375 according to one or more embodiments of the invention. FIG. 12A is a bottom view of a ceiling tile 1110 with an opening 1120. A support frame and back box assembly 375 may or may not have been placed on top of ceiling tile 1110. If a support frame and back box assembly 375 has been placed on top of ceiling tile 1110, opening 304 of support frame 300 will be in the same location as opening 1120 of ceiling tile 1110.

FIG. 12B shows how electrical leads 1015 are fed through opening 1120 of ceiling tile 1110 and attached to speaker cartridge 600, for example by using connectors such as connectors 1005 and 1010 of the embodiment of FIG. 10. If a support frame and back box assembly 375 has been placed on top of ceiling tile 1110, electrical leads 1015 may for example be internal electrical leads 920 of the embodiment of FIG. 9.

Figure 13A:
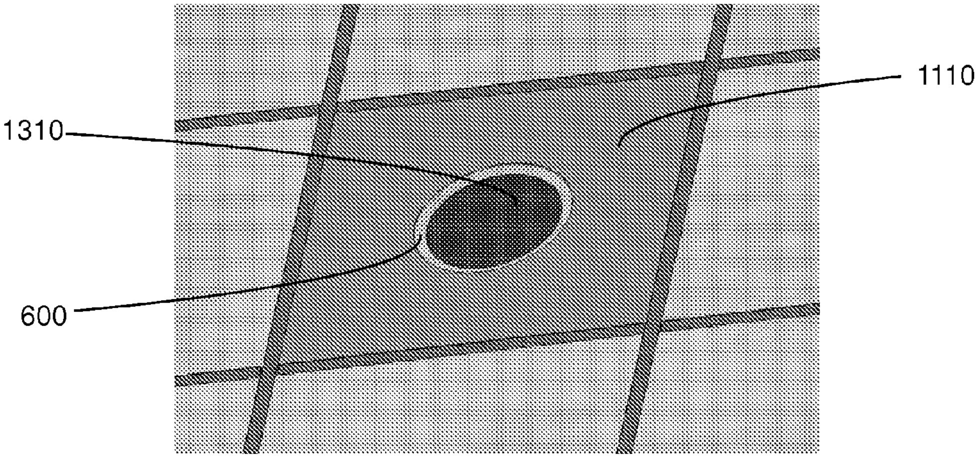
FIG. 13A is a perspective view of an embodiment of a speaker cartridge of the present invention mounted in a ceiling tile.
Figure 13B:
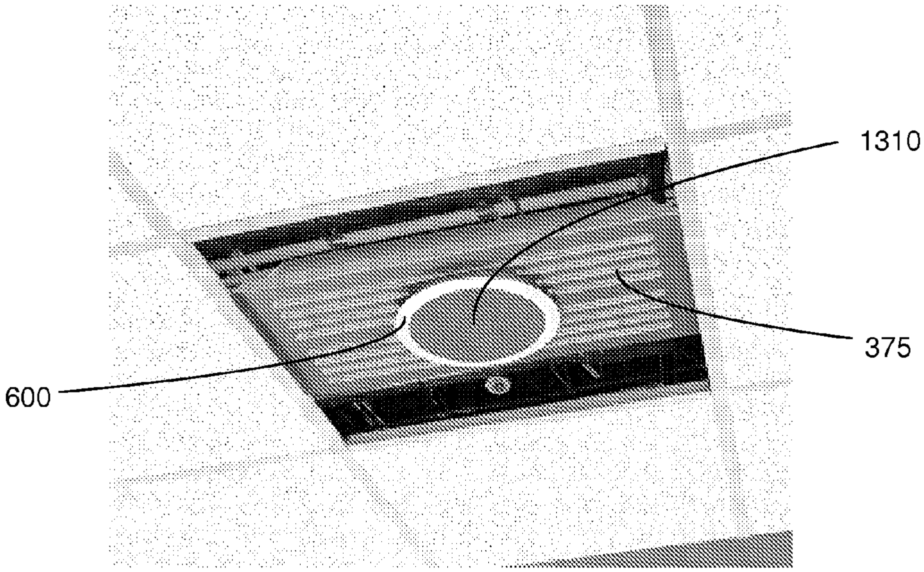
FIG. 13B is a cutaway perspective view of an embodiment of a speaker cartridge of the present invention mounted to an embodiment of a support frame and back box assembly of the present invention.

FIG. 12C shows how a screwdriver 1210 may be used to secure speaker cartridge 600 to ceiling tile 1110 (if no support frame and back box assembly 375 is present) or to ceiling tile 1110 and support frame 300 of support frame and back box assembly 375 (if a support frame and back box assembly 375 is present) by tightening bottom screw 1510, thereby moving flip dogs 620 from their retracted to engaged positions via access passages provided on the bottom side of speaker cartridge 600 such as, for example, orifices 802 of the embodiment of FIG. 8. After speaker cartridge 600 has been secured to ceiling tile 1110 and/or support frame and back box assembly 375, a detachable decorative grille 1310 may be attached to the bottom of speaker cartridge 600, as shown, for example, in FIG. 13A. In FIG. 13B, ceiling tile 1110 is rendered invisible to show the assembly of speaker cartridge 600 to support frame and back box assembly 375 in one or more embodiments of the invention.

Figure 19:
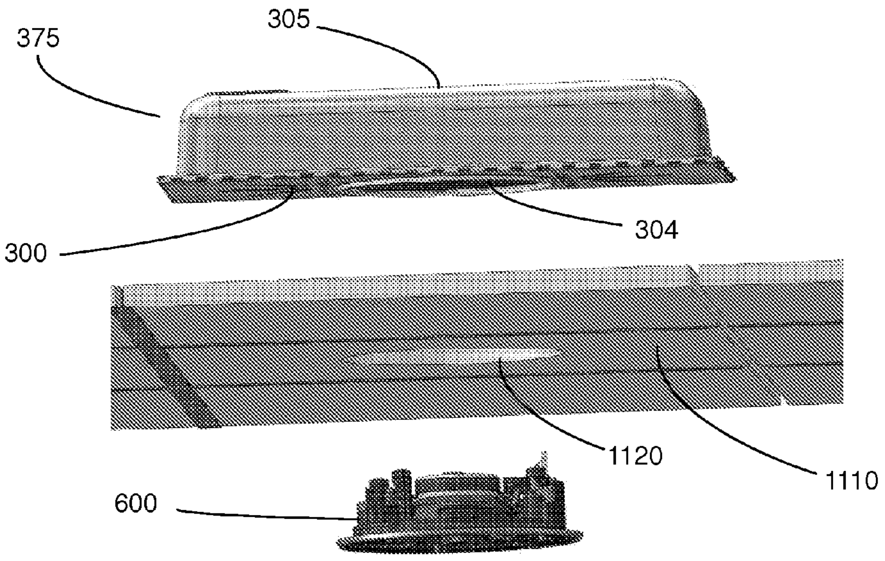
FIG. 19 is an exploded view showing components of an embodiment of the invention mounted to a ceiling tile.
Figure 20:
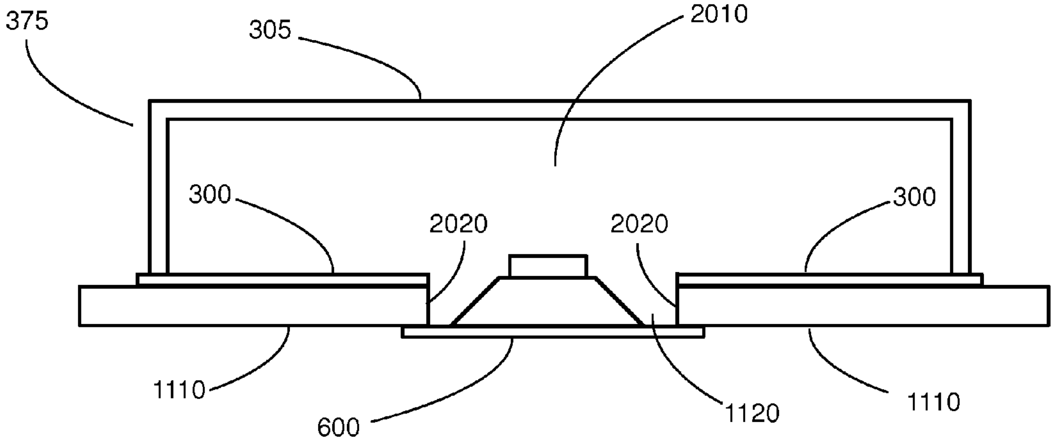
FIG. 20 is a schematic sectional view showing components of an embodiment of the invention mounted to a ceiling tile.

FIGS. 19 and 20 show how ceiling tile 1110 is sandwiched between speaker cartridge 600 and support frame 300 when speaker cartridge 600 is secured to ceiling tile 1110 and support frame and back box assembly 375 in one or more embodiments of the invention. As shown in FIG. 20, when speaker cartridge 600 and support frame and back box assembly 375 are mounted to ceiling tile 1110, opening 1120 through ceiling tile 1110 forms a passage having sidewall 2020 that, together with the interior volume of back box 305, forms a back volume 2010 for speaker cartridge 600.

Figure 21:
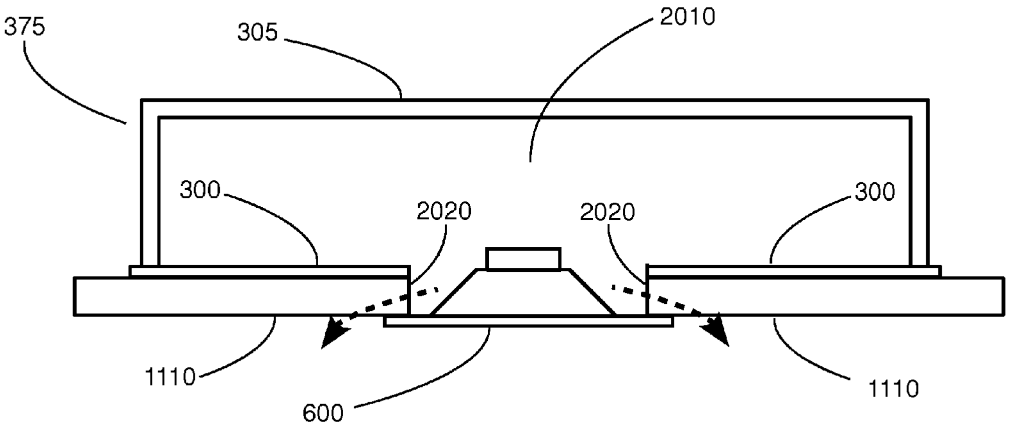
FIG. 21 is a schematic sectional view showing components of an embodiment of the invention mounted to a ceiling tile.

It will be appreciated by those of ordinary skill in the art that maintaining an acoustically sealed back volume is important to control the bass response of a speaker system. If ceiling tile 1110 is acoustically opaque, then there will be no leakage of sound through sidewall 2020. However, if ceiling tile 1110 is constructed from an open cell, acoustically porous material, then some sound can escape through back volume 2010 through sidewall 2020 as shown in FIG. 21, which can detrimentally affect the bass response of the speaker system.

Figure 22:
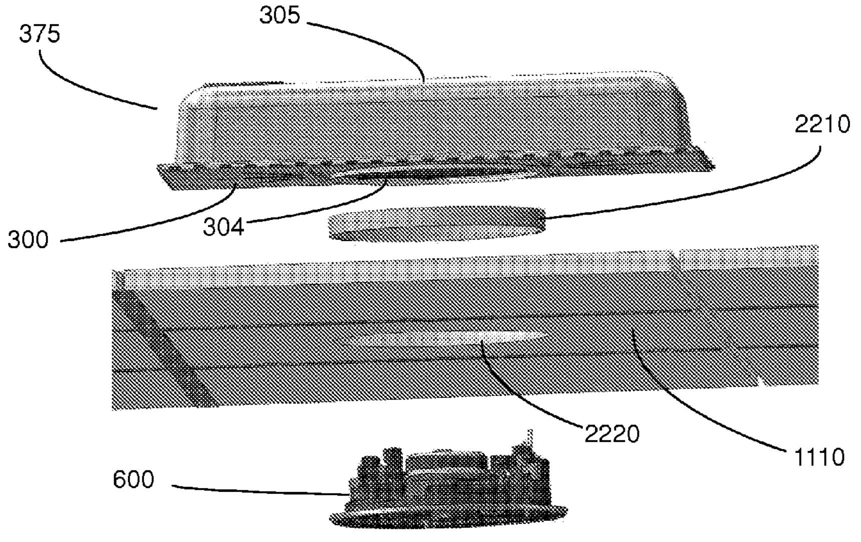
FIG. 22 is an exploded view showing components of an embodiment of the invention mounted to a ceiling tile.
Figure 23:
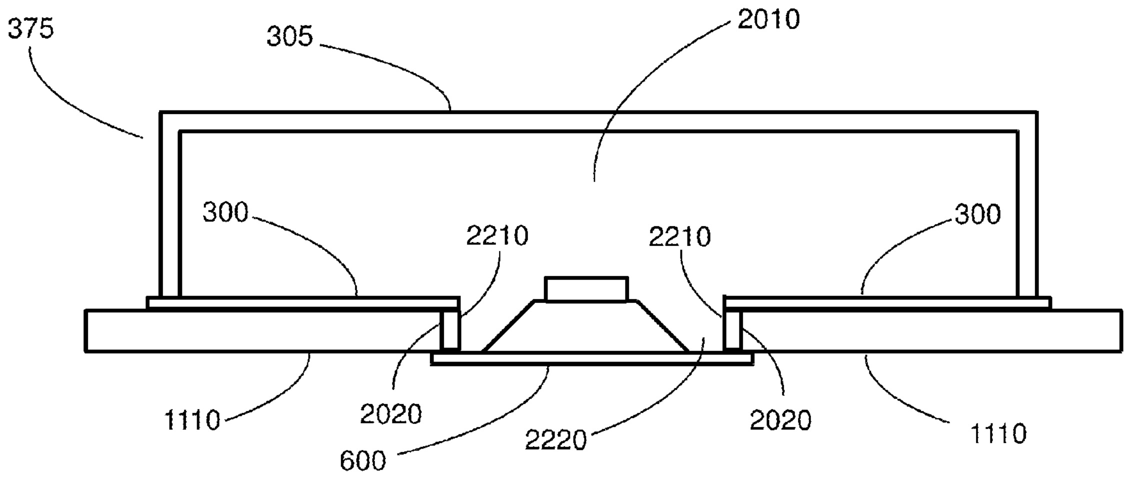
FIG. 23 is a schematic sectional view showing components of an embodiment of the invention mounted to a ceiling tile.

FIGS. 22 and 23 show an embodiment of the ceiling speaker system of the invention that includes an acoustically opaque sealing insert 2210 to prevent the "detuning" of the speaker system of the present invention when mounted to acoustically porous ceiling tiles. In the embodiment of FIGS. 22 and 23, insert 2210 comprises a ring whose outside diameter is approximately equal to the diameter of opening 2220 in ceiling tile 1110, whose inside diameter is approximately equal to the diameter of opening 304 of support frame 300, and whose height is slightly greater than the thickness of ceiling tile 1110. As shown in FIGS. 22 and 23, insert 2210 is placed in opening 2220 of tile 1110 so as to provide an acoustic barrier between back volume 2010 and side wall 2020 of porous tile 1110. In one or more embodiments, the diameter of opening 2220 of porous tile 1110 is greater than the diameter of opening 2010 of tile 1110 in the embodiment of FIG. 20 by an amount approximately equal to the thickness of insert 2210. In one or more embodiments, insert 2210 is formed of cardboard. However, insert 2210 can be formed of any material that provides a desired amount of acoustic opaqueness.

Thus one or more embodiments of a ceiling speaker system comprising a support frame and back box assembly and a mating speaker cartridge has been disclosed. An advantage of the disclosed invention is that it allows a division of labor in installing a ceiling speaker system that corresponds to a common division of labor in building trades. An example of such a division of labor is between a building contractor that installs a suspended ceiling, an electrician that installs building wires, and an audio/video system installer that installs speakers. Using one or more embodiments of the invention, a building contractor can place a support frame and back box assembly on top of a ceiling tile and cut an appropriate opening in the ceiling tile. The contractor typically would also install safety support wires (which may be required by applicable building and/or safety codes for seismic or other reasons) from the support frame and back box assembly to a support structure, such as a ceiling joist. An electrician can run external wiring to the electrical terminals of the back box of the support frame and back box assembly. After the support frame and back box assembly is in place in the ceiling and the external electrical wires have been attached, an audio/video system installer can attach the internal leads of the support frame and back box assembly to a speaker cartridge, and install the speaker cartridge into the ceiling tile and support frame and back box assembly from below.

Figure 1:
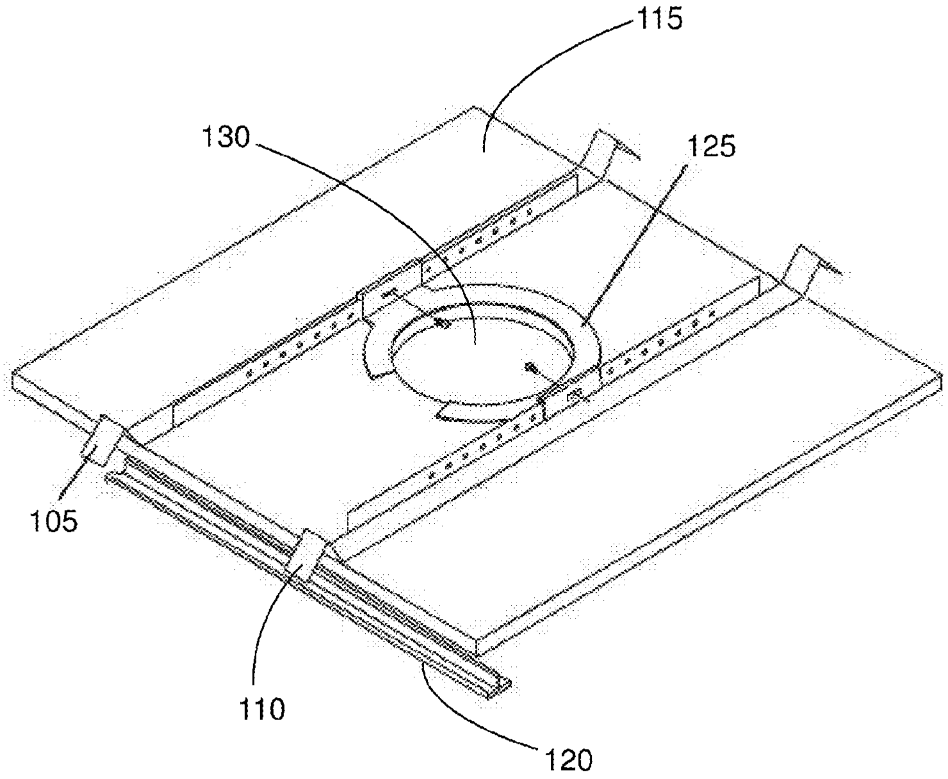
Figure 1 (Prior Art)
FIG. 1 is a perspective view of an embodiment of a support frame of the prior art.
Figure 2:
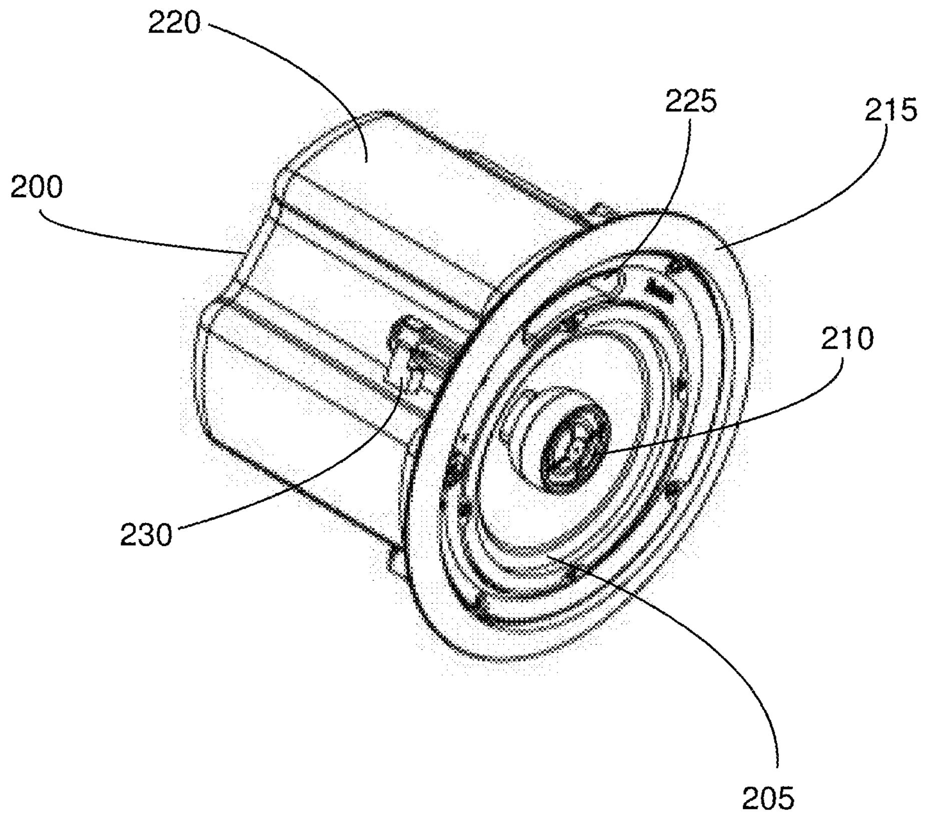
Figure 2 (Prior Art)
FIG. 2 is a perspective view of ceiling speaker assembly of the prior art.

A further advantage of the invention is that the support frame and back box assembly of the one or more embodiments of the invention forms a loudspeaker enclosure that has a relatively large volume but a low profile that allows installation in ceilings that have limited vertical clearance above the ceiling tiles. A further advantage is that in one or more embodiments, the fire-resistant back box encloses the entire rear of the speaker cartridge assembly, including its mounting hardware, which remain exposed in prior art ceiling speaker systems (such as, for instance, flip dogs 230 of the prior art ceiling speaker shown in FIG. 2 that are not enclosed by back can 230 and that could therefore be subjected directly to fire).

Although the present invention has been described with respect to certain specific embodiments, it will be clear to those skilled in the art that the inventive features of the present invention are applicable to other embodiments as well, all of which are intended to fall within the scope of the present invention. For example, although certain fastening methods and fasteners (e.g. screws) are disclosed for assembling various components of the invention, any other fastening methods and/or fasteners may be used (such as, for example, adhesives). Further, certain features of the invention can be used with other items other than a ceiling speaker. For example, the removable spacing tabs of the invention may be used with other items for which it would be useful to vary an overall dimension by discrete amounts, including items to be mounted in suspended ceilings, and elsewhere. Similarly, the flip dog assembly of the present invention can be used with other items that are intended to be mounted in holes in ceilings, walls, desktops, and elsewhere. Other variations of and uses for various aspects of the present invention will be apparent to those of skill in the art.

The invention claimed is:

1. A ceiling speaker support system comprising:

a support frame configured to rest upon a ceiling tile of a suspended ceiling, said support frame comprising a first opening configured to removably receive a cartridge comprising a loudspeaker inserted from below said ceiling tile through a second opening in said ceiling tile;

a back box configured to mount to said support frame above said support frame, said back box comprising a first interior volume;

a sealing insert configured to be disposed within said second opening adjacent to said first opening of said support frame so as to form a passage through said second opening, said passage comprising a second volume, said first and second volumes comprising a tuned acoustic back volume for said loudspeaker.

2. The ceiling speaker support system of claim 1 wherein said sealing insert is formed from an acoustically non-porous material.

3. The ceiling speaker support system of claim 2 wherein said sealing insert is formed from an acoustically opaque material.

4. The ceiling speaker support system of claim 3 wherein said sealing insert is formed from cardboard.

5. The ceiling speaker support system of claim 1 wherein said first opening has a first diameter, wherein said sealing insert has an outside diameter and an inside diameter smaller than said outside diameter, and wherein said inside diameter is approximately the same as said first diameter.

6. The ceiling speaker support system of claim 5 wherein said sealing insert has a thickness greater than a thickness of said ceiling tile.

7. The ceiling speaker support system of claim 1 wherein said sealing insert is configured to prevent acoustic leakage through said ceiling tile.

8. The ceiling speaker support system of claim 1 further comprising said cartridge mounted to said support frame.

9. The ceiling speaker support system of claim 8 wherein said cartridge comprises a lip configured to engage a bottom surface of said ceiling tile adjacent to said second opening.

10. The ceiling speaker support system of claim 9 wherein said sealing insert is disposed between said lip and a bottom surface of said support frame adjacent to said first opening.

* * * * *